United States Patent
Khazaka et al.

(10) Patent No.: US 10,622,210 B2
(45) Date of Patent: Apr. 14, 2020

(54) METHOD OF PRODUCING AN ELEMENT OF A MICROELECTRONIC DEVICE

(71) Applicant: COMMISSARIAT A L'ENERGIE ATOMIQUE ET AUX ENERGIES ALTERNATIVES, Paris (FR)

(72) Inventors: Rami Khazaka, Grenoble (FR); Yann Bogumilowicz, Grenoble (FR); Herve Boutry, Vinay (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/130,178

(22) Filed: Sep. 13, 2018

(65) Prior Publication Data
US 2019/0096671 A1 Mar. 28, 2019

(30) Foreign Application Priority Data
Sep. 13, 2017 (FR) .................. 17 58492

(51) Int. Cl.
*H01L 21/02* (2006.01)
*C30B 25/18* (2006.01)

(52) U.S. Cl.
CPC ........ *H01L 21/02647* (2013.01); *C30B 25/18* (2013.01); *H01L 21/02381* (2013.01); *H01L 21/02488* (2013.01); *H01L 21/02532* (2013.01); *H01L 21/02645* (2013.01)

(58) Field of Classification Search
None
See application file for complete search history.

(56) References Cited

U.S. PATENT DOCUMENTS

| 9,620,360 | B1 | 4/2017 | Borg et al. |
| 10,153,158 | B2 * | 12/2018 | Borg .................. H01L 21/02546 |
| 2012/0025195 | A1 | 2/2012 | McComber et al. |
| 2016/0024687 | A1 | 1/2016 | McComber et al. |

(Continued)

FOREIGN PATENT DOCUMENTS

WO  WO 2015/140329 A1  9/2015

OTHER PUBLICATIONS

French Preliminary Search Report dated Jun. 11, 2018 in French Application 17 58492 filed on Sep. 13, 2017 (with English Translation of Categories of Cited Documents and Written Opinion).

(Continued)

*Primary Examiner* — Bradley Smith
(74) *Attorney, Agent, or Firm* — Oblon, McClelland, Maier & Neustadt, L.L.P.

(57) ABSTRACT

The present invention relates to a method for producing an element of a microelectronic device on a support comprising a base layer, an inserted layer and a covering layer. The method includes forming a confinement volume including an etching of the inserted layer selectively to the base layer and to the covering layer, and filling, by a filling material constituting the element, of at least one part of the confinement volume by an epitaxial growth of the material from the side wall. The formation of the confinement volume comprises a formation of a hole through the whole thickness of the covering layer, and the etching is an anisotropic etching done by applying an etching on the inserted layer through the hole.

23 Claims, 2 Drawing Sheets

(56) References Cited

U.S. PATENT DOCUMENTS

2016/0351391 A1 12/2016 Borg et al.
2017/0170271 A1 6/2017 Borg et al.

OTHER PUBLICATIONS

Bogumilowicz, Y. et al. "Chemical vapour etching of Si, SiGe and Ge with HCl; applications to the formation of thin relaxed SiGe buffers and to the revelation of threading dislocations," Institute of Physics Publishing, Semicond. Sci. Technol. 20 (2005) 127-134, doi:10.1088/0268-1242/20/2/004, 2005, pp. 9.

Yamamoto, Y. et al., "Selective Lateral Germanium Growth for Local GeOI Fabrication," ECS Journal of Solid State Science and Technology, 3 (11) p. 353-p. 356, 2014, pp. 4.

Yamamoto, Y. et al. "Selective vapor phase etching of SiGe versus Si by HCl", Thin Solid Films, vol. 517, No. 1, 0040-6090, 2008, pp. 3.

Hartmann, J et al., "HCl selective etching of SiGe versus Si in stacks grown on (110)," Semiconductor Science and Technology, vol. 25., No. 10., 10.1088/0268-1242/25/10/105009, 2010, pp. 9.

\* cited by examiner

METHOD OF PRODUCING AN ELEMENT OF A MICROELECTRONIC DEVICE

FIELD OF THE INVENTION

The present invention relates to the production of device parts by lateral epitaxial growth of materials, in particular semi-conductive materials.

The invention advantageously, but not in a limiting manner, applies to the production of microelectronic devices. By microelectronic device, this means any type of device made with microelectronic means. These devices comprise, in particular in addition to devices of a purely electronic purpose, micromechanical or electromechanical devices (MEMS, NEMS, etc.), as well as optical or optoelectronic devices (MOEMS, etc.). A specific possible interest is the integration of semi-conductive materials having optoelectrical properties greater than those of silicon, such as germanium or materials of the type III-V, in conventional devices, for example silicon-based, for optoelectronic applications or CMOS technology applications. Also, hybrid integrations of different materials can be obtained, in particular within one same layer.

TECHNOLOGICAL BACKGROUND

In certain situations, in particular for producing device parts comprising germanium, methods are resorted to wherein germanium forms the subject of an epitaxial growth based on a portion of semi-conductive materials, generally silicon.

It is in this context, that the document Yamamoto et al. [Yamamoto et al. ECS Journal of Solid State Science and Technology 3, 353, 2014] discloses a germanium growth based on a silicon on insulator type substrate, also called SOI. According to this document, illustrated by FIGS. 1 and 2 of the present application, firstly producing silicon dioxide patterns in the form of tiles 4 spaced apart from one another above the SOI stack; this type of stack comprises a base layer 1, generally silicon, a buried insulating layer 2, generally of silicon dioxide and a superficial silicon layer 3 being used for the later construction of other parts of the device. An example of tiles 4 corresponding to FIG. 1a of this publication is given in FIG. 1. An etching of the superficial silicon will be proceeded with, making it possible to expose the buried layer in the zone 21 around the tiles 4 and to partially attack the superficial silicon layer below the tiles 4. This lateral attack is visible in FIG. 2. It makes it possible to release a volume confined between the upper surface of the buried layer 2, the lower surface of the tiles 4 and the side wall of the superficial residual layer 3. This volume then forms the subject of a filling with germanium 5 by lateral growth on the silicon wall of the cavity. This scientific publication further outlines that the defects, schematised in the reference 6 in FIG. 2, can be observed in germanium coming from the growth, in particular in the proximity of the interface with the silicon. FIGS. 3 and 4 show the defects that can thus be encountered during the growth of germanium, with the planar defects and orientation problems. In the conclusion thereof, Yamamoto et al. indicate that the parts having defects can be removed later by an additional lithography followed by an etching process. It emerges that this method leads to numerous steps without guaranteeing the quality of the portion ultimately produced from germanium.

It is an aim of the invention, to overcome at least partially the disadvantages of the current techniques, in particular by proposing an improved method.

SUMMARY OF THE INVENTION

A non-limiting aspect of the invention relates to a method of an embodiment of an element of a microelectronic device on a support. The support successively comprises a base layer, an inserted layer and a covering layer.

The method firstly comprises a formation of a confinement volume, the formation including an etching of the layer selectively inserted at the base layer and at the covering layer, and the volume being delimited by a side wall of the inserted layer, an upper face of the base layer and a lower face of the covering layer, the lower face being situated facing the exposed face.

Moreover, a filling is carried out, by a filling material constituting the element, of at least one part of the confinement volume by an epitaxial growth of the material from the side wall. Advantageously, the material of the inserted layer has a crystallographic structure of the centred face cubic type.

Advantageously, the formation of the confinement volume comprises a formation of a hole through the whole thickness of the covering layer so as to expose a zone of the inserted layer.

Furthermore, according to an advantageous aspect of non-limiting embodiments, the etching can be a dry etching done by a surface reaction limitation etching system, by applying an etching flow on the layer inserted through the hole. According to another advantageous aspect of embodiments of the invention, the etching can be a wet etching. Alternatively or cumulatively to the advantageous aspects above, the etching is possibly configured to produce an etching speed at least 25% greater in the crystallographic directions [110] and [1-10] than in the crystallographic directions [010] and [100] of the material of the inserted layer, and preferably at least 35% greater.

Thus, a cavity is produced, forming the confinement volume and obtained by an etching of which the speed along the directions [110] and [1-10] is favoured, at the expense of the directions [010] and [100] because of the selection of the surface reaction limitation etching system. The cross-section of the wall of the cavity is thus square at almost production tolerances. Plus, the directions of the sides of the square correspond to the directions [010] and [100]. Yet, the applicant has commented that the epitaxial growth is less subject to the defects, when it is done by the flanks oriented along such directions. It has been observed therefore, that a lot less defects by comparison with a cavity wall which would be obtained by a dry etching with a system limited by the mass transport, which is more isotropic and would lead to an octagonal cross-section, therefore having additional orientation flanks favouring the defects.

By means of the hole of the covering layer, the etching is also easily centred in a zone of the inserted layer and is produced progressively radially in the direction in the thickness of this layer. The cavity is finally highly confined in this configuration, producing the elements, for example made of germanium, with good shape definition.

Of course, this method can be reproduced in various places of the support, so as to produce a plurality of elements simultaneously.

Another aspect that can be separated from the present invention, relates to a device which can be obtained by the method. Advantageously, it has a square cross-section.

BRIEF INTRODUCTION OF THE FIGURES

Other characteristics, aims and advantages of the present invention will appear upon reading the following detailed description, regarding the appended drawings, given as non-limiting examples, and on which:

Figure 1:
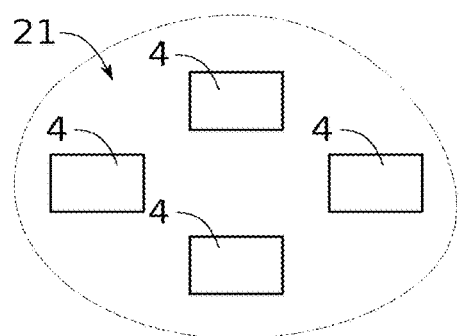
FIG. 1 illustrates, as a top view, a teaching from document Yamamoto et al. [Yamamoto et al. ECS Journal of Solid State Science and Technology 3, 353, 2014]
Figure 2:
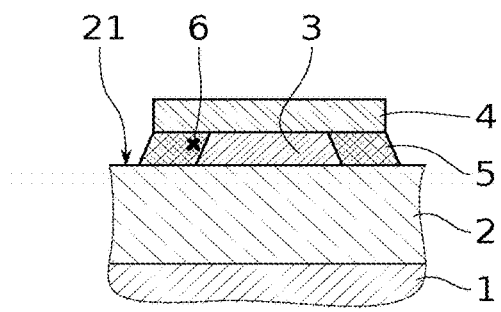
FIG. 2 shows a partial cross-section view of the structure of FIG. 1.
Figure 3:
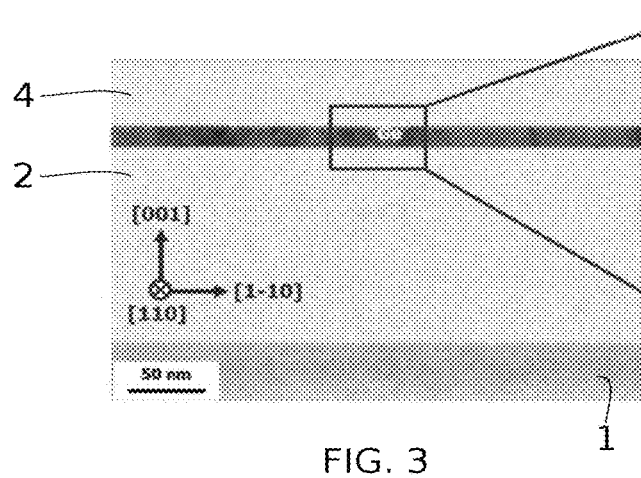
Figure 4:
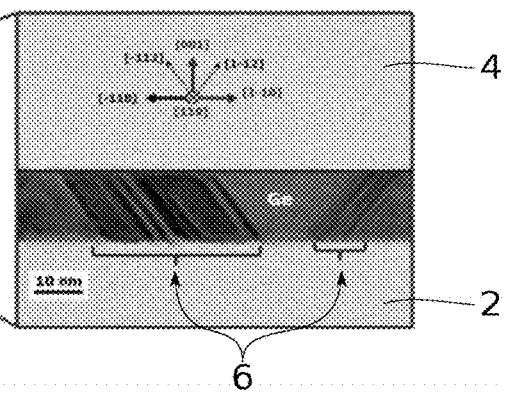
Figure 5:
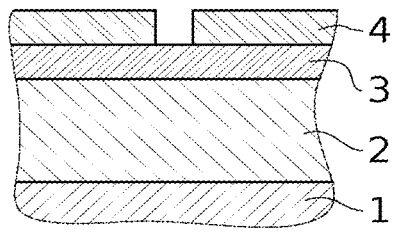
Figure 6:
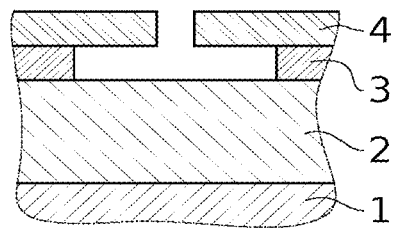
Figure 7:
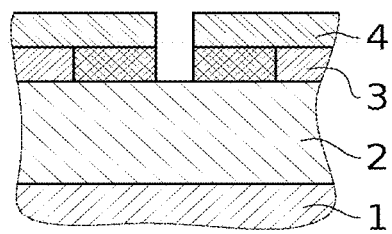
Figure 8:
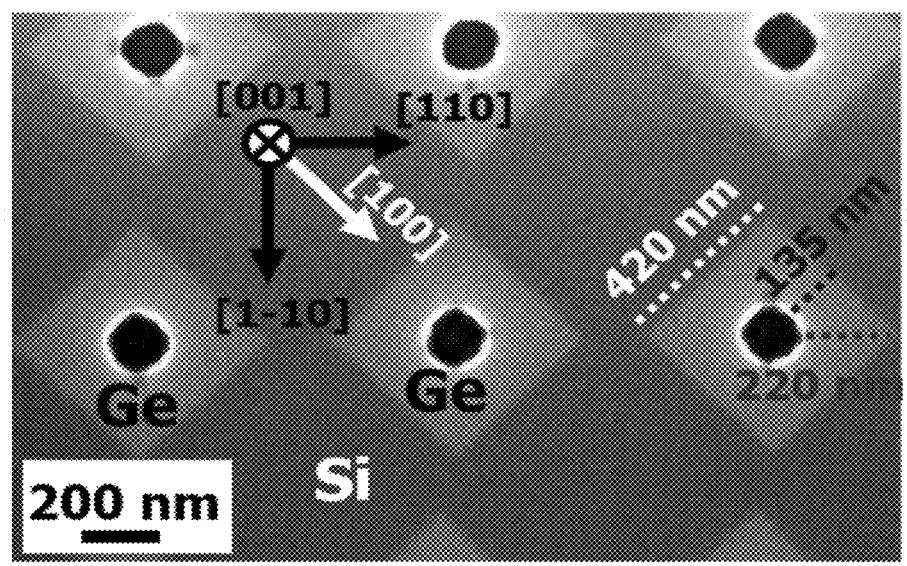

FIGS. 3 and 4 present possibilities of defects during a growth of germanium;

FIGS. 5 to 7 are schematic views of three steps of a non-limiting embodiment of the invention;

FIG. 8 shows, as a top view, a possible result obtained thanks to the invention.

The drawings are given as examples, and are not limiting of the invention. They constitute schematic representations of principle, intended to facilitate the understanding of the invention and are not necessarily to the scale of practical applications, In particular, the relative thicknesses of the layers are not representative of the reality,

DETAILED DESCRIPTION

Before starting a detailed review of embodiments of the invention, below are stated optional characteristics which can possibly be used according to any association or alternatively:

- the etching is configured to produce an etching speed at least 25% greater in the crystallographic directions [110] and [1-10] than in the crystallographic directions [010] and [100] of the material of the inserted layer 3, and preferably at least 35% greater;
- an inserted layer 3 is selected, of which the material has a crystallographic structure of the cubic type of which two opposite faces are directed perpendicularly to the dimension in thickness of the inserted layer 3;
- the inserted layer 3 is selected with a dimension in thickness less than 300 nm;
- the formation of the hole is configured to obtain a hole diameter of between 50 and 200 nm, preferably equal to 150 nm;
- the etching is a dry etching produced by an etching flow in a vapour phase chemical deposit machine;
- the filling is produced by chemical vapour deposition in the chemical vapour deposition machine;
- an inserted layer made of material with a crystallographic structure of the diamond or zinc-blend type is used;
- the inserted layer 3 is made of semi-conductive material;
- silicon is used as semi-conductive material;
- the etching is a dry etching done at a temperature less than 850° C., preferably less than 820° C. and preferably equal to 800° C.;
- the temperature is greater than 700° C., and preferably greater than 750° C.;
- a semi-conductive material is used as a filling material 5;
- germanium is used as a filling material 5;
- the base layer 2 is a buried, electrically insulating layer and the inserted layer 3 is a layer of a semi-conductive material, forming a semi-conductive on insulator stack.

It is specified that, in the scope of the present invention, the term "on" or "above" does not compulsorily mean "in contact with". Thus, for example, the deposit of a layer on another layer, does not compulsorily mean that the two layers are directly in contact with one another, but this means that one of the layers covers, at least partially, the other, by being, either directly in contact thereof, or by being separated from it by a film, or also another layer or another element. A layer can moreover be composed of several sublayers of one same material or of different materials.

It is specified that in the scope of the present invention, the thickness of a layer or of the substrate is measured along a direction perpendicular to the surface according to which this layer or this substrate has the maximum extension thereof.

In a manner known per se, the method of the invention can be implemented based on a support comprising or constituted of a stack of the semi-conductive on insulator type, In this context, FIG. 5 presents, for example, a stack of which the lower layer is formed by a semi-conductive substrate, for example made of silicon and bearing reference 1. Above this layer 1, an electrically insulating layer 2 is situated, it is also called base layer in the description below. It can be a buried oxide layer generally known under the acronym BOX (buried oxide). In the most common case, this layer 2 is made of silicon dioxide, but the invention does not exclude other insulating materials, in particular from other oxides or nitrides. Above the layer 2, a layer 3 can be typically made of a semi-conductive material, in particular silicon. Highly advantageously, the layer 3 has a crystallographic structure of centred face cubic type.

In particular, two opposite faces of the cubic casing of the crystal are advantageously directly perpendicularly to the thickness of the material layer 3; the crystallographic direction [001] is thus directed along the dimension in thickness of the layer 3.

For example, materials can be used having a diamond or zinc-blend type crystal structure. A diamond or zinc-blend type crystal generally comprises an atom:

- at the 8 tops of a cube;
- at the centre of each of the faces of this cube;
- in four of the eight tetrahedral sites of the cube, i.e. at the centre of the tetrahedron formed by a corner of the cube and the three atoms at the centre of the three faces adjacent to this corner.

This material layer can be the superficial layer of an SOI stack, the base layer 2 forming the insulating layer of this stack. As an example, the thickness of the layer 3 is less than or equal to 300 nm, preferably less than 150 nm and in particular between 10 and 100 nanometres.

A monocrystalline nature of the layer 3 is beneficial to produce an anisotropic etching, contrary to amorphous or polycrystalline materials.

As FIG. 5 shows, the layer 3 is surmounted on a layer, called covering layer 4. Insofar as the layer 3 is located between the layers 2 and 4, it is called, in the case of the invention, "inserted layer".

The covering layer can be an oxide layer of the semi-conductive material of the inserted layer 3. For example, a silicon dioxide layer, in particular of a thickness of between 50 and 100 nanometres, and preferably 70 nm, can be deposited above an inserted layer 3 made of silicon. For example, a thermal oxidation method can be used from the semi-conductive material of the layer 3 to create the layer 4. This thermal oxidation can be obtained at a temperature of between 800 and 1000° C. and with an input of water vapour or dioxygen. In particular, if it is desired to start from an inserted layer of reduced thickness, for example also an oxide layer, in particular silicon can be formed, deposited preferably by CVD, for example of TEOS type (of formula Si(OEt)$_4$) or HTO for high temperature oxide).

Preferably, at this stage of the method, all the layers present are deposited as a solid plate. Preferably, the layers are parallel to one another and have flat surfaces. Advantageously, the inserted layer (3) is configured to completely cover the base layer (2).

FIG. 5 shows the creation of at least one hole through the whole of the thickness of the covering layer 4, so as to reach the inserted layer 3. The use of holes makes it possible to reach the inserted layer 3 only through the upper face thereof, that which is surmounted by the covering layer. This exposed zone of the inserted layer is directly transversally (typically perpendicularly) to the direction in thickness of the layers. The etching is done by attacking the material of the layer 3 from the portion of the upper face of the latter, accessible by the hole and progressively around this access, in all directions, but with an etching speed difference along the directions. The etching thus implemented is therefore, at least in one first phase, centred with respect to the hole. Advantageously, as many holes are formed as cavities, and are to be created to produce a plurality of elements obtained by lateral growth. As an example, creating holes can be done by etching. The hole(s) comprise(s) a closed cross-section and the latter can be of variable shape. In particular, holes of circular cross-section can be formed, in particular having a diameter, advantageously of 150 nm having another cross-section shape of which the greatest dimension in the plane is greater than 100 nm and/or less than 200 nm and possibly equal to 150 nm. The etching can be a dry etching. Conventional methods can be resorted to, to produce this localised etching, in particular with lithographic methods. Advantageously, to control the etching of the hole by sparing at least partially the thickness of the inserted layer 3, the kinetics of the etching is controlled and/or the etching fluid in the case of a wet etching is selected to be selective so as to attack the material of the covering layer 4 without attacking, or by slightly attacking, the inserted layer 3. An acid of the hydrofluoric acid (HF) type can suit for this purpose. However, rather an anisotropic dry plasma etching will be used, which avoids expanding the etching hole too much, contrary to a more isotropic wet etching.

The hole thus formed makes it possible to access the layer 3 to apply an etching there. The latter is configured to be selective relative to the covering and base layers so as to only attack the inserted layer 3 and not the materials of the layers which surround it. In the case of the silicon dioxide layers 2 and 4, an etching of the silicon can be used, forming the inserted layer which does not attack the silicon dioxide. As an example, an etching with an HCl flow can suit for such a selectivity.

After a certain etching time, a cavity constituting a confinement volume is obtained, visible in the cavity in FIG. 6. As an example, the dimension in width, perpendicularly to the dimension in thickness of the layers, can be greater than 200 nm and/or less than 2 microns, and for example between 400 nm and 1200 nm, The etching duration makes it possible to adjust the lateral dimension of the cavity. A portion of the inserted layer 3 must be preserved. Indeed, the cavity is defined laterally by the latter, and in the lower part by the base layer, and in the upper part by the covering layer, The precision of delimiting the cavity and the specific placement of the access, by the hole, for the etching of the material of the inserted layer, will be noted. Preferably, the etching is configured such that the edge of the cavity is of a closed cross-section, advantageously fully in the layer 3. Possibly, the cavity will be formed, so as to preserve at least two side walls in the sacrificial material, the other walls could be made of the same material, or of another material.

According to the invention, the etching of the inserted layer 3 is done specifically, so as to control the shape and the orientation of the cavity. Indeed, the applicant has observed that it was clearly desirable to produce a cavity of square cross-section, oriented specifically from a point of view of the crystallography of the material which constitutes this layer, To this end, the etching is advantageously not produced conventionally with a dry etching at a relatively increase temperature to reach an etching system, limited by mass transport. These conditions lead to an isotropic etching and different facets will be disclosed, which leads to the formation of defects, in particular on the facets of the type [110]. On the contrary, thus fighting a prejudice, the invention advantageously uses, according to an embodiment, a surface reaction limitation system to implement a plasma type dry etching.

To achieve this, the device is advantageously introduced into a chemical vapour deposition (CVD) reactor. The etching, for example with a hydrochloric acid (HCl) vapour flow for the case of a material to be etched of the silicon type, is done. The temperature of this etching is selected so as to remain in the context of a surface reaction limitation etching system. In particular, in the case of silicon, the etching temperature will be strictly less than 850° C., preferably less than 820° C. In this example, the pressure of the flow can be between 10 Torr and atmospheric pressure, and preferably equal to 80 Torr. An H$_2$ flow is also advantageously generated, for example between a few 1 slm and 40 slm, preferably 20 slm (slm means "standard liters per minute"). The HCl flow can be between 1 slm and 20 slm, and preferably 15 slm.

The temperature selected will depend on the fluid used for the etching. Thus, if, instead of HCl, an etching by nitrogen-present Cl$_2$ is used, the temperature can be significantly reduced, for example below 750° C. If the inserted layer 3 is made of germanium, an etching temperature of strictly less than 500° C. can typically be used, advantageously less than 475° C., and preferably less than 450° C., to preserve the system limited by surface reaction. According to another example, the inserted layer 3 is made of silicon germanium, with a proportion of the type Si$_{0.67}$Ge$_{0.33}$ to which case, this etching system can be maintained up to a temperature at most of 775° C. and preferably less than or equal to 750° C. For a silicon germanium of the type Si$_{0.50}$Ge$_{0.50}$ the maximum temperature will be 750° C. and preferably less than or equal to 730° C. It is understood that the maximum temperature to be selected depends on the variations in concentrations of germanium and of silicon in this case.

The etching speed can be varied, by managing the pressure of the vapour flow of the etching fluid.

According to another possibility, the etching is a wet etching. For example, an etching liquid can be applied through the hole. In the case of silicon as an example of material to be etched, a solution, preferably aqueous and comprising potassium hydroxide. The wet etching, applied to a confined space, makes it possible to obtain an etching speed difference along the crystallographic directions.

Generally, the etching of the invention is configured to produce different etching speeds along the crystallographic directions of the material of the layer 3, According to a preferred case, the etching, dry or wet, is configured to obtain an etching speed, greater in the crystallographic directions [110] and [1-10], at the expense of the etching speeds of the directions [010] and [100]. Preferably, these speed differences are significant, and at least 25% between the favoured directions and the non-favoured directions. This difference can increase to more than 35%. It is understood, that the highest speed is at least 25% (even at least 35%, and possibly at least 60%) greater than the lowest speed. In particular, a greater etching speed will be favoured in the crystallographic directions [110] and [1-10], at the expense of the etching speeds of the directions [010] and [100]. For example, the etching speed in the direction [110] can be greater than or equal to 27 nm/minute and/or the etching speed in the direction [010] can be of around 16 nm/minute. According to another embodiment, the etching speed difference is at least 5 nm/minute, and possibly of at least 7, even 10 nm/minute.

Generally, the etching of the invention is anisotropic, in particular in the directions of planes, perpendicular to the thickness of the layer and configured so as to produce a square cross-section cavity. It is to oppose an isotropic etching, expanding the cavity without producing a square.

The directions of the greatest speeds will define the diagonals of a square, at almost production tolerances. Because of this, the sides of the square are oriented along the crystallographic direction [100] or perpendicularly to this direction. This point is important for the growth phase of the filling material, such as germanium.

This filling is advantageously done by an epitaxy produced in the same reactor as that having been used for the etching of the material of the inserted layer 3. As an example, germanium can be deposited selectively in the cavity by using a gaseous source of $H_2$—$GeH_4$ at a temperature of between 350° C. and 650° C., preferably 400° C.

The result obtained is schematised in FIG. 7, with the presence of the filling material 5 in a part of the cavity produced previously. The volume ultimately occupied by the filling material 5 will depend on the duration and the parameters of this growth phase. FIG. 8 shows, as a top view, the covering layer 4 which has been, in this case, previously removed, an example of a result obtained for a plurality of cavities filled with germanium. The very well defined square cross-section and the orientation ideally directly from the facets of the germanium element will be noted. The germanium defects are considerably reduced from it. Indeed, the growth is produced only in the directions, perpendicular to the facets of the square cross-section of the cavities, these directions being the least suitable for the defects. In particular, if the etching of the inserted layer had been done in a manner other than according to the invention, a cavity cross-section of the octagonal type would have been obtained, with etching directions, unfortunately favourable to defects.

The advantageous example of germanium for the filling has previously been given, but the invention can be implemented with other semi-conductive materials, materials of the type III-V and materials of the group IV, such as GaAS, InAs, GaSb, SiC, or any materials capable of growing by epitaxy on the material of the inserted layer 3.

Except for any specific indication on the contrary, the technical characteristics described in detail for a given embodiment, can be combined with the technical characteristics described in the context of other embodiments described as a non-limiting example, of which those explained in detail above.

REFERENCES

1. Substrate
2. Base layer
3. Inserted layer
4. Covering layer
5. Filling material
6. Defects

The invention claimed is:

1. A method for producing an element of a microelectronic device on a support successively comprising a base layer, an inserted layer and a covering layer, said method comprising:
    forming a confinement volume including an etching of the inserted layer selectively to the base layer and to the covering layer, the confinement volume being delimited by a side wall of the inserted layer, an upper face of the base layer and a lower face of the covering layer, the lower face being situated facing an exposed face of the covering layer; and
    filling, by a filling material constituting the element, of at least one part of the confinement volume by an epitaxial growth of the material from the side wall, the filling material having a cubic type crystallographic structure, wherein
    the formation of the confinement volume comprises a formation of a hole through a whole thickness of the covering layer so as to expose a zone of the inserted layer, and
    the etching is done by applying an etching on the inserted layer through the hole in a zone of the inserted layer centred around the hole, either by a dry etching to an etching system limited by the surface reaction, or by a wet etching.

2. The method according to claim 1, wherein the etching is configured to produce an etching speed at least 25% greater in the crystallographic directions [110] and [1-10] than in the crystallographic directions [010] and [100] of the material of the inserted layer.

3. The method according to claim 1, wherein an inserted layer of which the material has a cubic type crystallographic structure is selected, of which two opposite faces are directed perpendicularly to the dimension in thickness of the inserted layer.

4. The method according to claim 1, wherein the inserted layer is selected with a dimension in thickness less than 300 nm.

5. The method according to claim 1, wherein the formation of the hole is configured to obtain a hole diameter of between 50 and 200 nm.

6. The method according to claim 1, wherein the etching is a dry etching produced by an etching flow in a chemical vapour deposition machine.

7. The method according to claim 6, wherein the filling is produced by chemical vapour deposition in the chemical vapour deposition machine.

8. The method according to claim 1, wherein an inserted layer made of diamond or zinc-blend type crystallographic structure material is used.

9. The method according to claim 1, wherein the inserted layer is made of a semi-conductive material.

10. The method according to claim 9, wherein silicon is used as a semi-conductive material.

11. The method according to claim 10, wherein the etching is a dry etching, done at a temperature less than 850° C.

12. The method according to claim 11, wherein the temperature is greater than 700° C.

13. The method according to claim 1, wherein the inserted layer is configured to completely cover the base layer.

14. The method according to claim 1, wherein a semi-conductive material is used as a filling material.

15. The method according to claim 14, wherein germanium is used as a filling material.

16. The method according to claim 15, wherein the base layer is a buried, electrically insulating layer and the inserted layer is a layer made of a semi-conductive material, forming a semi-conductive on insulator stack.

17. The method according to claim 2, wherein the etching is configured to produce an etching speed at least 35% greater in the crystallographic directions [110] and [1-10] than in the crystallographic directions [010] and [100] of the material of the inserted layer.

18. The method according to claim 5, wherein the formation of the hole is configured to obtain a hole diameter of 150 nm.

19. The method according to claim 11, wherein the etching is a dry etching done at a temperature less than 820° C.

20. The method according to claim 11, wherein the etching is a dry etching done at a temperature equal to 800° C.

21. The method according to claim 12, wherein the temperature is greater than 750° C.

22. The method according to claim 1, wherein the etching forms the confinement under the hole and centred on the hole.

23. The method according to claim 1, wherein the etching is configured to produce an etching speed in a range of 25% to about 69% greater in the crystallographic directions [110] and [1-10] than in the crystallographic directions [010] and [100] of the material of the inserted layer.

* * * * *